United States Patent [19]

Tomita

[11] Patent Number: 4,988,951
[45] Date of Patent: Jan. 29, 1991

[54] QUADRATURE PHASE DEMODULATOR CAPABLE OF OPERATING UNDER A WIDE INPUT DYNAMIC RANGE

[75] Inventor: Hideho Tomita, Tokyo, Japan

[73] Assignee: NEC Corporation, Japan

[21] Appl. No.: 513,826

[22] Filed: Apr. 24, 1990

[30] Foreign Application Priority Data

Apr. 25, 1989 [JP] Japan .................................. 1-106230

[51] Int. Cl.⁵ ............................................. H03D 3/00
[52] U.S. Cl. .................................... 329/345; 329/313;
455/214; 455/337
[58] Field of Search ...................... 329/313, 345, 346;
455/214, 337

[56] References Cited

U.S. PATENT DOCUMENTS 4,910,469 3/1990 Takahashi ........................... 329/345

Primary Examiner—David Mis
Attorney, Agent, or Firm—Laff, Whitesel, Conte & Saret

[57] ABSTRACT

In a demodulator for demodulating into a demodulated signal a quadrature phase modulated signal having a large varying amplitude caused by various radio transmission link conditions, a preprocessing circuit (21) logarithmically processes the envelope to produce a first preprocessed signal having a logarithmically compressed and digitized amplitude and limits the amplitude to multiple values to produce a second preprocessed signal. A phase detecting circuit (22) detects a phase difference between a reference signal having a reference frequency and the second preprocessed signal and produces a phase difference signal representative of the phase difference. A processing circuit (23) processes the first preprocessed signal and the phase difference signal to produce first and second processed signals collectively as the demodulated signal. Preferably, the processing circuit comprises an exponential processor for exponentially processing the first preprocessed signal to produce an exponentially processed signal as the first processed signal.

7 Claims, 4 Drawing Sheets

QUADRATURE PHASE DEMODULATOR CAPABLE OF OPERATING UNDER A WIDE INPUT DYNAMIC RANGE

BACKGROUND OF THE INVENTION

This invention relates to a quadrature phase demodulator which is used as a counterpart of a quadrature phase modulator and which is capable of operating under a wide input dynamic range. Such a demodulator is particularly useful in a mobile radio telephone network which comprises a base station having a service area and a plurality of mobile stations present in the service area. Each of the base and the mobile stations comprises a quadrature phase modulator and a receiver.

In the quadrature phase modulator, a pair of quadrature-phase carrier signals are modulated by an input signal into a quadrature phase modulated signal. The quadrature phase modulated signal is delivered to a transmitter connected to the quadrature phase modulator. The transmitter transmits the quadrature phase modulated signal to a receiver of another station through a radio transmission path or link. The receiver receives the quadrature phase modulated signal. A quadrature phase demodulator connected to the receiver is supplied with the quadrature phase modulated signal as a demodulator input signal from the receiver. The quadrature phase demodulator demodulates the demodulator input signal to a demodulated signal. The demodulator input signal has a large varying amplitude caused by various radio transmission link conditions. In order to control the amplitude, the demodulator generally comprises an automatic gain control circuit in addition to a phase detector. However, the automatic gain control circuit has a degraded gain control characteristic when the amplitude varies drastically. This is serious in case where the demodulator input signal includes a burst signal. This means that the quadrature phase modulator has a narrow dynamic range and is undesirable for use in demodulating the demodulator input signal having the amplitude which varies drastically.

SUMMARY OF THE INVENTION

It is therefore an object of this invention to provide a quadrature phase demodulator which is capable of operating under a wide input dynamic range.

It is another object of this invention to provide a quadrature phase demodulator which is suitable for a mobile radio telephone network.

Other objects of this invention will become clear as the description proceeds.

On describing the gist of this invention, it is possible to understand that a demodulator is operable for demodulating into a demodulated signal a quadrature phase modulated signal, that operates on receiving an input signal, as a demodulator input signal, with a large varying amplitude caused by various radio transmission link conditions.

The above-mentioned demodulator comprises preprocessing means responsive to the quadrature phase modulated signal for logarithmically processing the demodulator input signal to produce a first preprocessed signal and for limiting the amplitude to multiple values to produce a second preprocessed signal. The demodulator further comprises phase detecting means connected to the preprocessing means for detecting a phase difference between a reference signal having a reference frequency and the second preprocessed signal to produce a phase difference signal representative of the phase difference, and processing means connected to the preprocessing means and the phase detecting means for processing the first preprocessed signal and the phase difference signal to produce first and second processed signals collectively as the demodulated signal.

Figure 1:
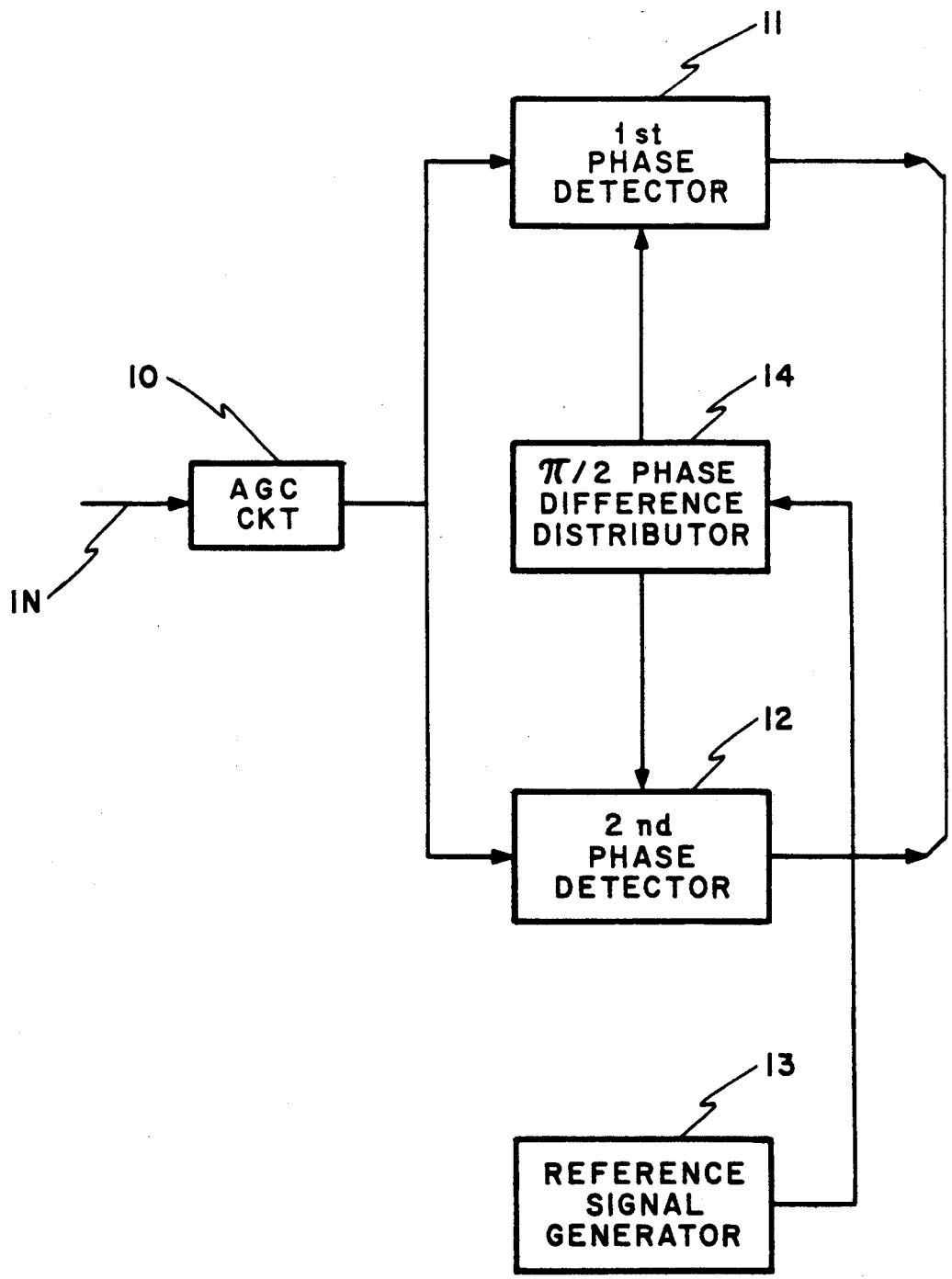
FIG. 1 is a block diagram of a conventional quadrature phase demodulator.

DESCRIPTION OF THE PREFERRED EMBODIMENT:

Referring to FIG. 1, a conventional quadrature phase demodulator will be described at first in order to facilitate an understanding of the present invention. The conventional quadrature phase demodulator is of the type described hereinabove and is for use as a counterpart of a quadrature phase modulator. In the manner known in the art, the quadrature phase modulator modulates a pair of quadrature-phase carrier signals by an input signal into a quadrature phase modulated signal. The quadrature phase modulated signal is delivered to a transmitter connected to the quadrature phase modulator. The transmitter transmits the quadrature phase modulated signal to a receiver through a radio transmission path. The receiver receives the quadrature phase modulated signal and supplies the quadrature phase modulated signal to a quadrature phase demodulator as a demodulator input signal IN having an input amplitude as amplitude information. The input amplitude varies by various radio transmission link conditions. The amplitude information is useful in monitoring reception electric field strength of the demodulator input signal.

The quadrature phase demodulator comprises an automatic gain control circuit 10 for controlling the input amplitude of the demodulator input signal IN. The automatic gain control circuit 10 delivers a gain controlled signal to first and second phase detectors 11 and 12, each of which has a predetermined detection characteristic. The quadrature phase demodulator further comprises a reference signal generator 13 for generating a reference signal having a reference frequency. The reference signal serves as a reproduced carrier signal. A $\pi/2$-phase difference distributor 14 is supplied with the reference signal and produces first and second reference signals. The first reference signal has a quadrature phase difference relative to the second reference signal. The first and the second reference signals are supplied to the first and the second phase detectors 11 and 12, respectively. The first and the second phase detectors 11 and 12 carry out phase detection of the gain controlled signal with reference to the first and the second reference signals, respectively. As a result of the phase detection, the first and the second phase detectors 11 and 12 produce in-phase and quadrature detection signals, respectively, collectively as a demodulated signal.

By the way, the automatic gain control circuit 10 produces the gain controlled signal having a great amplitude when the input amplitude varies drastically. Such a phenomenon tends to occur when the demodulator input signal IN includes a burst signal. In this event, each of the first and the second phase detectors 11 and 12 are saturated by the great amplitude. As a result, the first and the second detection signals lose the amplitude information.

Taking the above into consideration, it might be possible that the automatic gain control circuit 10 is removed from the quadrature phase demodulator. If the automatic gain control circuit 10 were omitted, a detection error would be caused by offset in each of the first and the second phase detectors 11 and 12 when the demodulator input signal IN has a lower amplitude.

Figure 2:
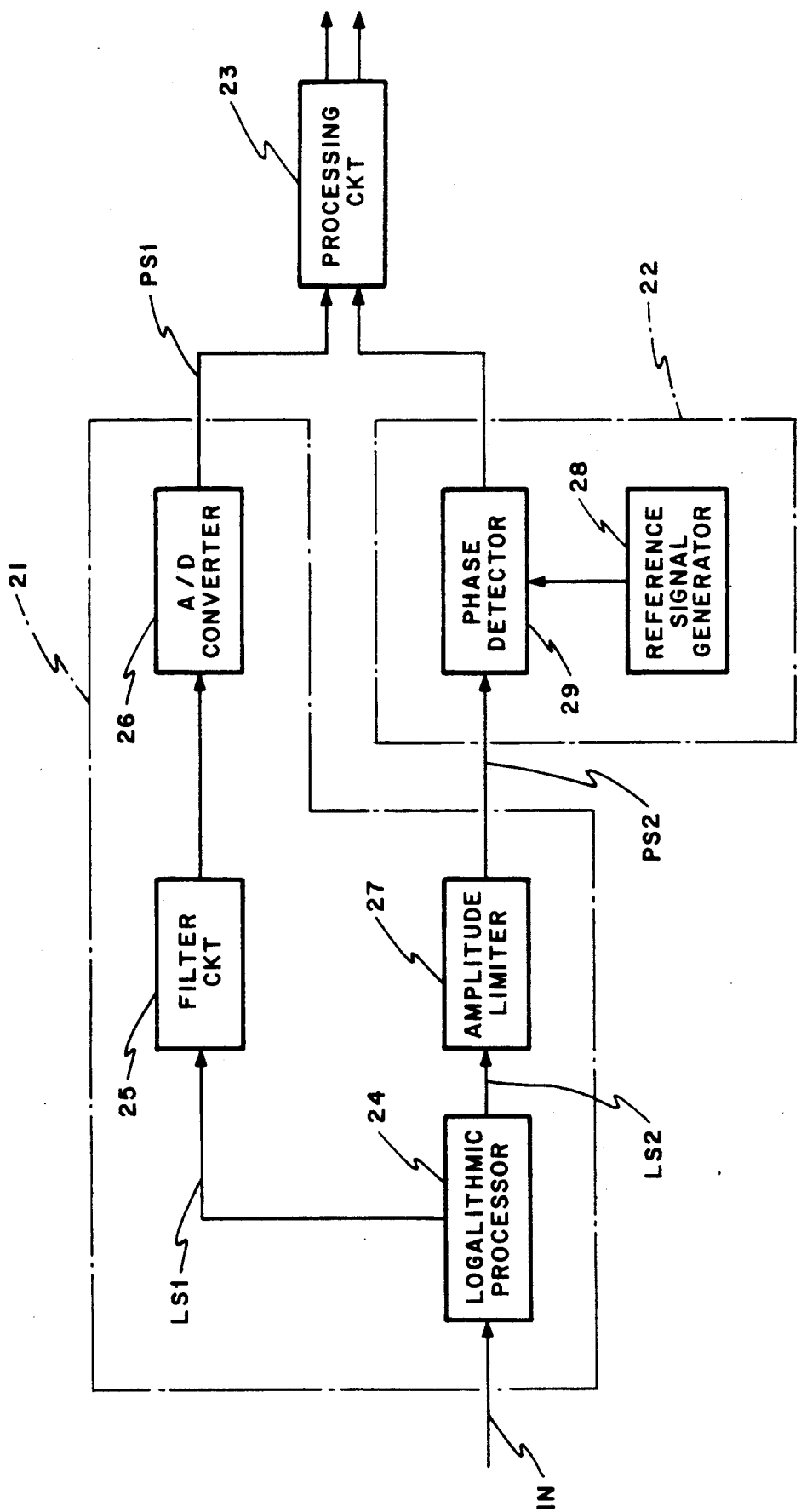
FIG. 2 is a block diagram of a quadrature phase demodulator according to an embodiment of this invention.

Referring to FIG. 2, the description will proceed to a quadrature phase demodulator according to a preferred embodiment of this invention. The quadrature phase demodulator demodulates the demodulator input signal IN into a demodulated signal. As described before, the demodulator input signal IN is received with a large varying amplitude caused by the various radio transmission link conditions.

The quadrature phase demodulator comprises a preprocessing circuit 21, a phase detecting circuit 22, and a processing circuit 23. The preprocessing circuit 21 logarithmically processes the input amplitude to produce a first preprocessed signal PS1 and limits the input amplitude to multiple values, such as binary zero and one values, to produce a second preprocessed signal PS2. The preprocessing circuit 21 comprises a logarithmic processor 24 supplied with the demodulator input signal IN. The logarithmic processor 24 compresses the input amplitude in accordance with logarithmic conversion to produce a first logarithmically processed signal LS1 defining a compressed amplitude and logarithmically limits the input amplitude to produce a second logarithmically processed signal LS2 having a limited amplitude. The logarithmic processor 24 may be implemented by a logarithmic amplifier. The first logarithmically processed signal LS1 is supplied to a filter circuit 25. The filter circuit 25 removes an unnecessary high frequency component from the first logarithmically processed signal LS1 and delivers a filtered signal to an analog-to-digital converter 26. The analog-to-digital converter 26 digitizes the filtered signal to produce a converted digital signal as the first preprocessed signal PS1. The first preprocessed signal PS1 has a logarithmically compressed and digitized amplitude and is supplied to the processing circuit 23. The logarithmically compressed and digitized amplitude is represented by $\log|r|$ where r represents the input amplitude.

The second logarithmically processed signal LS2 is supplied to an amplitude limiter 27. The amplitude limiter 27 limits the limited amplitude within the predetermined range and delivers an amplitude limited signal, as the second preprocessed signal PS2, to the phase detecting circuit 22.

The phase detecting circuit 22 comprises a reference signal generator 28 and a phase detector 29. The reference signal generator 28 generates a reference signal having a reference frequency and supplies the reference signal to the phase detector 29. Supplied with the second preprocessed signal PS2 and the reference signal, the phase detector 29 detects a phase difference between the second preprocessed signal PS2 and the reference signal. The phase detector 29 produces a phase difference signal representative of the phase difference. The phase detector 29 can detect the phase difference by utilizing zero crossing information because the second preprocessed signal PS2 is limited in amplitude.

The phase difference signal is supplied to the processing circuit 23. The processing circuit 23 processes the first preprocessed signal and the phase difference signal to produce first and second processed signal collectively as the demodulated signal.

Figure 3:
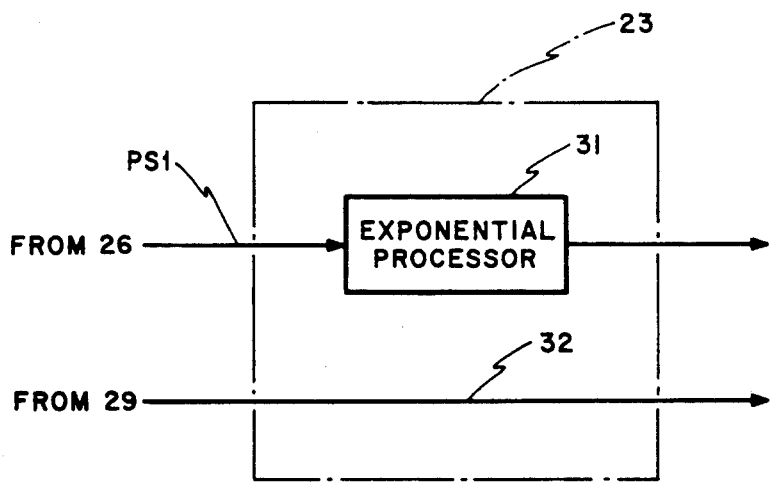
FIG. 3 is a block diagram of a first example of a processing circuit illustrated in FIG. 2.

Referring to FIG. 3, the processing circuit 23 produces the first processed signal which represents the amplitude information as $|r|$ on a polar coordinate system and the second processed signal representative of the phase information. The processing circuit 23 comprises an exponential processor 31 which is supplied with the first preprocessed signal PS1.

The exponential processor 31 exponentially processes the first preprocessed signal PS1 in accordance with exponential conversion. The exponential conversion should be an inverse conversion relative to the logarithmic conversion. The exponential processor 31 produces an exponentially processed signal having a linear or expanded amplitude, as the first processed signal. The exponential processor may be implemented by an exponential amplifier. The phase difference signal is outputted as the second processed signal through an output line 32.

If the demodulator input signal has a wide amplitude range, the logarithmically compressed and digitized amplitude has a maximum value. In this event, an increased bit number is required to represent the amplitude information. In order to represent the amplitude information with a reduced bit number, floating-point representation may be used.

Figure 4:
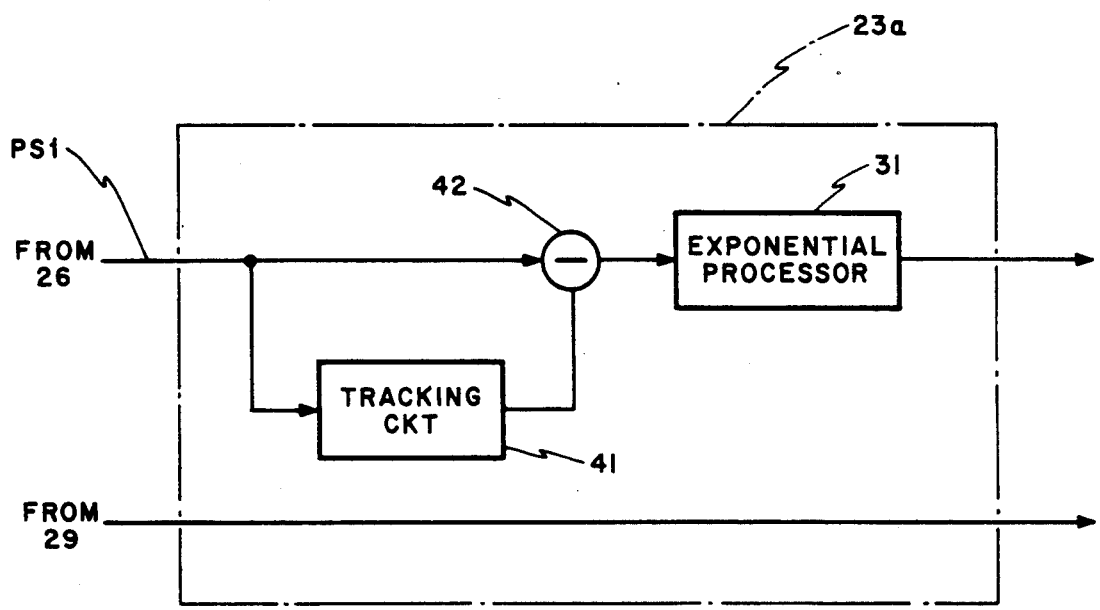
FIG. 4 is a block diagram of a second example of the processing circuit illustrated in FIG. 2.

Referring to FIG. 4, the description will proceed to a processing circuit 23a which is a first modification of the processing circuit 23 shown in FIG. 3. The processing circuit 23a is useful in case where the demodulator input signal has the wide amplitude range. The processing circuit 23a comprises a tracking circuit 41 for tracking the logarithmically compressed and digitized amplitude to find the maximum value to produce a maximum value signal representative of the maximum value. The processing circuit 23a further comprises a subtracter 42 which is supplied with the maximum value signal and the first preprocessed signal PS1. The subtracter 42 subtracts the logarithmically compressed and digitized amplitude from the maximum value to produce an amplitude difference signal representative of an amplitude difference between the logarithmically compressed and digitized amplitude and the maximum value. The amplitude difference signal is supplied to the exponential processor 31. The exponential processor 31 produces the exponentially processed signal, as the first processed signal, in the polar coordinate system. The phase detection signal is outputted through the output line 32 as the second processed signal representative of the phase information. When the processing circuit 23a is used, the quadrature phase demodulator has a wide dynamic range which is approximately equal to 90 decibels.

Figure 5:
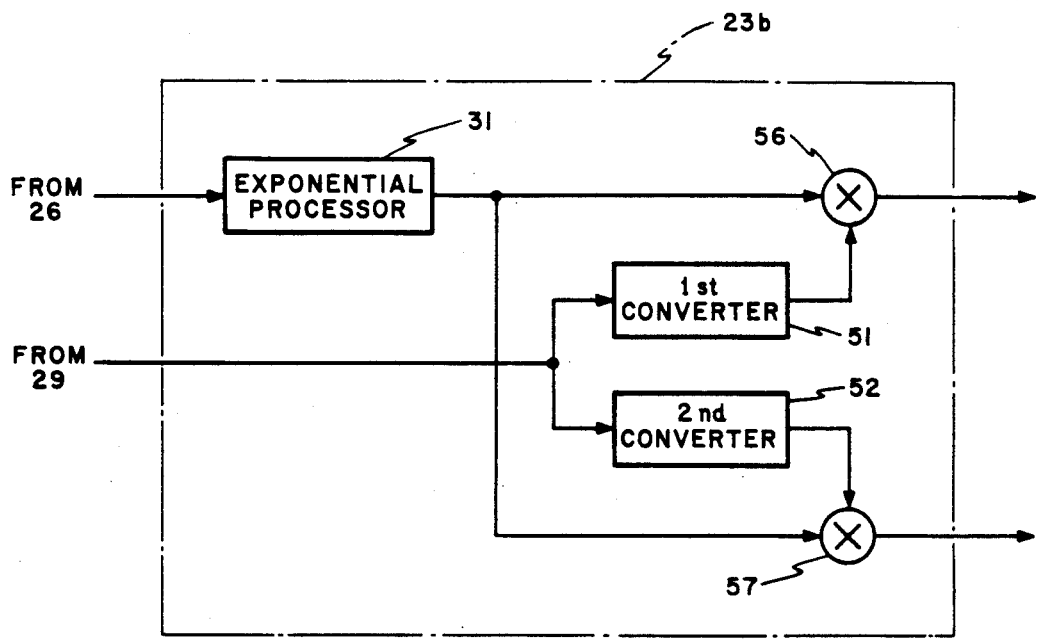
FIG. 5 is a block diagram of a third example of the processing circuit illustrated in FIG. 2.

Referring to FIG. 5, the description will proceed to a processing circuit 23b which is a second modification of the processing circuit 23 shown in FIG. 3. In the example being illustrated, the processing circuit 23b produces the first and the second processed signals on an orthogonal coordinate system. The processing circuit 23b comprises first and second converters 51 and 52 and first and second multipliers 56 and 57 in addition to the exponential processor 31.

The phase detection signal is supplied to the first and the second converters 51 and 52. The first converter 51 converts the phase difference into a sine function to produce a sine function signal representative of the sine function. The second converter 52 converts the phase difference into a cosine function to produce a cosine function signal representative of the cosine function. Each of the first and the second converters 51 and 52 may be implemented an ROM (read-only memory). The sine and the cosine function signals are supplied to the first and the second multipliers 56 and 57, respectively.

The exponential processor 31 is supplied with the first preprocessed signal PS1 and produces the exponentially processed signal in the manner described in conjunction with FIG. 3. The exponentially processed signal is supplied to the first and the second multipliers 56 and 57.

The first multiplier 56 multiplies the exponentially processed signal by the sine function signal to produce a first multiplied signal, as the first processed signal, represented by $(\log^{-1}|r|)\sin\theta$ when r and $\theta$ represent the amplitude and the phase difference, respectively. The second multiplier 57 multiplies the exponentially processed signal by the cosine function signal to produce a second multiplied signal, as the second processed signal, represented by $(\log^{-1}|r|)\cos\theta$. The first and the second multiplied signals may be called in-phase and quadrature detection signals, respectively, and have the phase information and the amplitude information.

Figure 6:
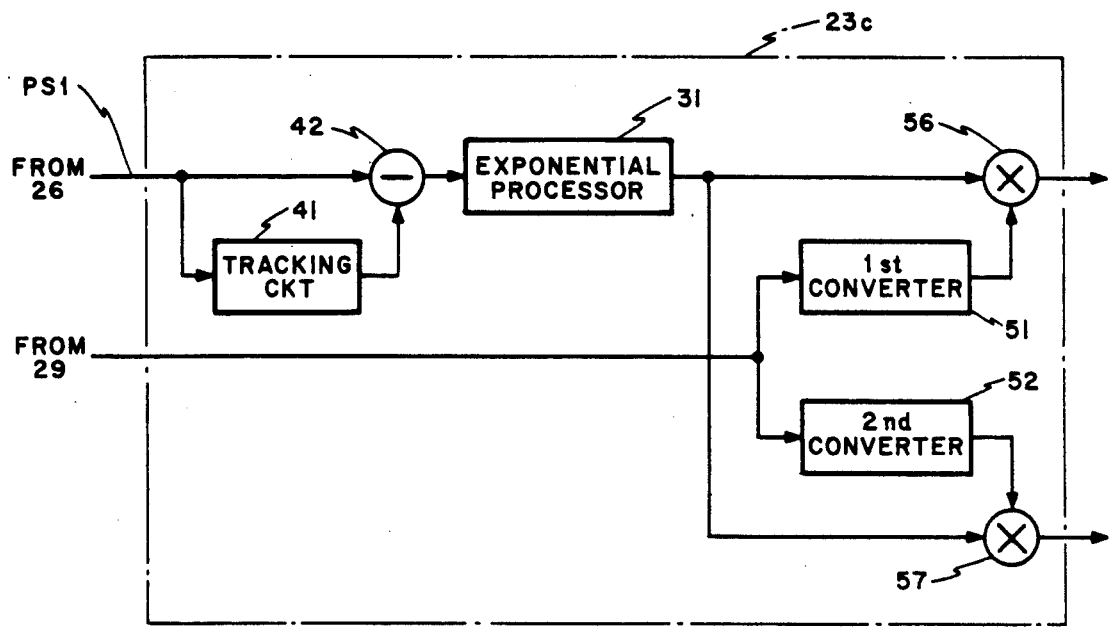
FIG. 6 is a block diagram of a fourth example of the processing circuit illustrated in FIG. 2.

Referring to FIG. 6, the description will proceed to a processing circuit 23c which is a third modification of the processing circuit 23 shown in FIG. 3. The processing circuit 23c is a combination of the processing circuit 23b shown in FIG. 5 and the tracking circuit 41 and the subtracter 42 which are illustrated in FIG. 4. The processing circuit 23c produces the first and the second processed signals in the orthogonal coordinate system. The processing circuit 23c is useful in case where the demodulator input signal has the wide amplitude range.

As described in conjunction with FIG. 4, the first preprocessed signal PS1 has the logarithmically compressed and digitized amplitude having the maximum value and is supplied to the tracking circuit 41 and the subtracter 42. The tracking circuit 41 tracks the logarithmically compressed and digitized amplitude and delivers the maximum value signal representative of the maximum value to the subtracter 42. The subtracter 42 subtracts the logarithmically compressed and digitized amplitude from the maximum value and produces the amplitude difference signal representative of the amplitude difference between the logarithmically compressed and digitized amplitude and the maximum value. The amplitude difference signal is supplied to the exponential processor 31. The exponential processor 31 delivers the exponentially processed signal to the first and the second multipliers 56 and 57.

The phase difference signal is supplied to the first and the second converters 51 and 52. The first converter 51 converts the phase difference into the sine function and produces the sine function signal representative of the sine function. The second converter 52 converts the phase difference into the cosine function and produces the cosine function signal representative of the cosine function. The sine and the cosine function signals are supplied to the first and the second multipliers 56 and 57, respectively. The first multiplier 56 multiplies the exponentially processed signal by the sine function signal and produces the first multiplied signal, as the first processed signal, represented by $(\log^{-1}|r|)\sin\theta$. The second multiplier 57 multiplies the exponentially processed signal by the cosine function signal and produces the second multiplied signal, as the second processed signal, represented by $(\log^{-1}|r|)\cos\theta$. Each of the first and the second multiplied signals has the phase information and the amplitude information.

While this invention has thus far been described in conjunction with a single embodiment thereof, it will readily be possible for those skilled in the art to put this invention into practice in various manners. For example, the phase detector may be implemented by a digital circuit provided that the second preprocessed signal has a low frequency. The quadrature phase demodulator according to this invention is applicable not only the mobile radio telephone network but also a radio communication network in general.

What is claimed is:

1. A demodulator for demodulating into a demodulated signal a quadrature phase modulated signal, that operates on receiving an input signal, as a demodulator input signal, with a large varying amplitude caused by various radio transmission link conditions, wherein the improvement comprises:

preprocessing means responsive to said quadrature phase modulated signal for logarithmically processing said demodulator input signal to produce a first preprocessed signal and for limiting said amplitude to multiple values to produce a second preprocessed signal;

phase detecting means connected to said preprocessing means for detecting a phase difference between a reference signal having a reference frequency and said second preprocessed signal to produce a phase difference signal representative of said phase difference; and processing means connected to said preprocessing means and said phase detecting means for processing said first preprocessed signal and phase difference signal to produce first and second processed signals collectively as said demodulated signal.

2. A demodulator as claimed in claim 1, wherein said preprocessing means comprises:

a logarithmic processor responsive to said quadrature phase modulated signal for compressing said amplitude in accordance with logarithmic conversion to produce a first logarithmically processed signal and for limiting said demodulator input signal to produce a second processed signal having a limited amplitude;

an analog-to-digital converter connected to said logarithmic processor for digitizing said first logarithmically processed signal to produce a converted digital signal as said first preprocessed signal;

and an amplitude limiter connected to said logarithmic processor for limiting said limited amplitude with said multiple values to produce an amplitude limited signal as said second preprocessed signal.

3. A demodulator as claimed in claim 2, wherein said phase detecting means comprises:

a reference signal generator for generating said reference signal; and a phase detector connected to said amplitude limiter and said reference signal generator for generating said reference signal; and a phase detector connected to said amplitude limiter and said reference signal generator for detecting said phase difference to produce a phase detection signal as said phase difference signal.

4. A demodulator as claimed in claim 3, wherein said processing means comprises:

an exponential processor connected to said analog-to-digital converter for exponentially processing said converted digital signal in accordance with exponential conversion to produce an exponentially processed signal as said first processed signal; and producing means for producing said phase difference signal as said second processed signal.

5. A demodulator as claimed in claim 4, said converted digital signal having a logarithmically compressed and digitized amplitude having a maximum value, wherein said processing means further comprises:

a tracking circuit connected to said analog-to-digital converter for tracking said logarithmically compressed and digitized amplitude to find said maximum value to produce a maximum value signal representative of said maximum value; and a subtracter connected to said analog-to-digital converter and said tracking circuit for subtracting said maximum value signal from said converted digital signal to supply a difference signal, as said converted digital signal to said exponential processor.

6. A demodulator as claimed in claim 3, wherein said processing means comprises:

an exponential processor connected to said analog-to-digital converter for exponentially processing said converted digital signal in accordance with exponential conversion to produce an exponentially processed signal;

a first converter connected to said phase detector and responsive to said phase difference signal for converting said phase difference to a sine function to produce a sine function signal representative of said sine function;

a second converter connected to said phase detector and responsive to said phase difference signal for converting said phase difference to a cosine function to produce a cosine function signal representative of said cosine function;

a first multiplier connected to said exponential processor and said first converter for multiplying said exponentially processed signal by said sine function signal to produce a first multiplied signal as said first processed signal; and a second multiplier connected to said exponential processor and said second converter for multiplying said exponentially processed signal by said cosine function signal to produce a second multiplied signal as said second processed signal.

7. A demodulator as claimed in claim 6, said converted digital signal having a logarithmically compressed and digitized amplitude having a maximum value, wherein said processing means further comprises:

a tracking circuit connected to said analog-to-digital converter for tracking said logarithmically compressed and digitized amplitude to find said maximum value to produce a maximum value signal representative of said maximum value signal; and a subtracter connected to said analog-to-digital converter and said tracking circuit for subtracting said maximum value signal from said converted digital signal to supply a difference signal, as said converted digital signal, to said exponential processor.

* * * * *